United States Patent
Kim et al.

(10) Patent No.: US 8,902,673 B2
(45) Date of Patent: Dec. 2, 2014

(54) METHOD OF TESTING A SEMICONDUCTOR MEMORY DEVICE

(75) Inventors: Hong-Beom Kim, Hwaseong-si (KR); Hyun-Soon Jang, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 324 days.

(21) Appl. No.: 13/439,271

(22) Filed: Apr. 4, 2012

(65) Prior Publication Data

US 2012/0257461 A1 Oct. 11, 2012

(30) Foreign Application Priority Data

Apr. 5, 2011 (KR) .......................... 10-2011-0031208

(51) Int. Cl.
 *G11C 7/10* (2006.01)
 *G11C 29/02* (2006.01)
 *G11C 29/12* (2006.01)
 *G11C 29/48* (2006.01)

(52) U.S. Cl.
 CPC .............. *G11C 29/022* (2013.01); *G11C 29/48* (2013.01); *G11C 29/1201* (2013.01)
 USPC ................. 365/189.05; 365/189.17; 365/201; 365/233.13

(58) Field of Classification Search
 CPC ...... G11C 11/401; G11C 29/02; G11C 29/50; G11C 29/34; G11C 7/1051; G11C 7/1078; G11C 7/1066; G11C 7/1072; G11C 7/22
 USPC ................. 365/201, 233.13, 189.17
 See application file for complete search history.

(56) References Cited

U.S. PATENT DOCUMENTS

| 6,323,664 | B1  | 11/2001 | Kim et al.            |         |
|-----------|-----|---------|-----------------------|---------|
| 6,550,026 | B1* | 4/2003  | Wright et al. ........ | 714/719 |
| 7,117,406 | B2* | 10/2006 | Onodera .............. | 714/718 |
| 7,552,369 | B2  | 6/2009  | Kawakubo              |         |
| 2006/0203567 | A1* | 9/2006 | Poechmueller ......... | 365/189.01 |
| 2009/0196114 | A1 | 8/2009 | Mine                  |         |
| 2010/0027354 | A1 | 2/2010 | Matsui et al.         |         |

FOREIGN PATENT DOCUMENTS

KR  1020010010733  2/2001

* cited by examiner

*Primary Examiner* — Tha-O H Bui
(74) *Attorney, Agent, or Firm* — F.Chau & Associates, LLC

(57) ABSTRACT

A method of testing a semiconductor memory device includes writing first data to a memory cell array in the semiconductor memory device, loading second data from the memory cell array onto a plurality of data pads of the semiconductor memory device, rewriting the second data to the memory cell array, and outputting test result data through one or more test pads. The first data is received from an external device through the one or more test pads, which correspond to one or more of the plurality of data pads. The test result data is based on the rewritten data in the memory cell array.

20 Claims, 15 Drawing Sheets

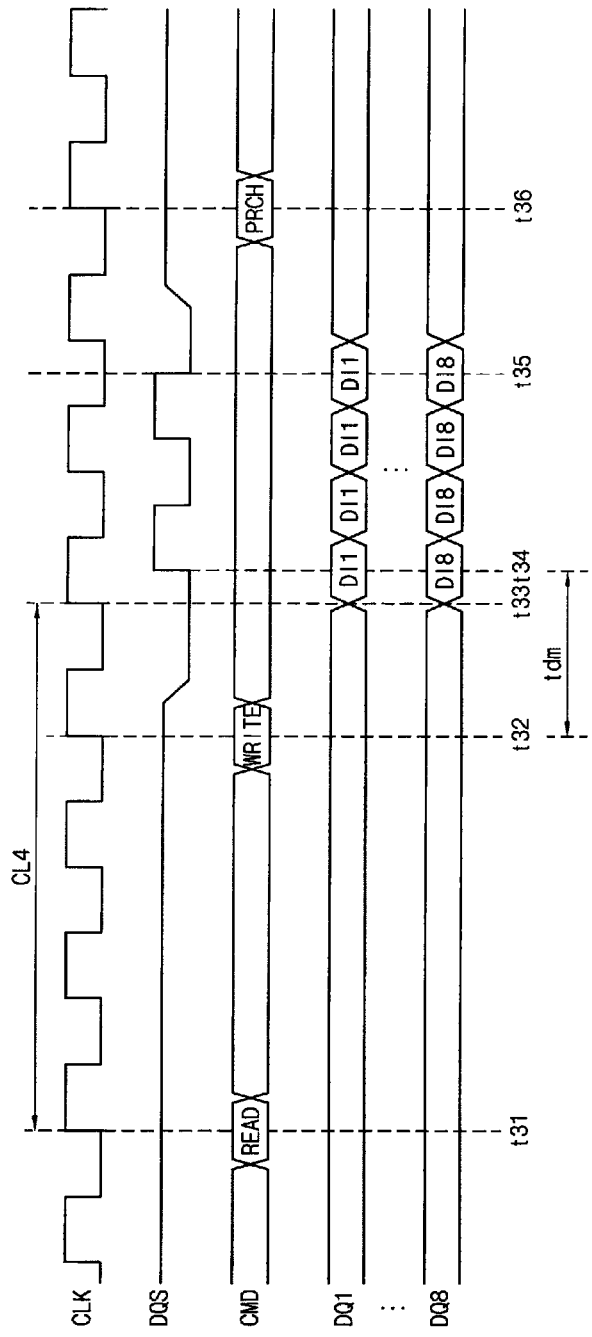

METHOD OF TESTING A SEMICONDUCTOR MEMORY DEVICE

CROSS-REFERENCE TO RELATED APPLICATIONS

This application claims priority under 35 USC §119 to Korean Patent Application No. 10-2011-0031208, filed on Apr. 5, 2011, the disclosure of which is incorporated by reference herein in its entirety.

TECHNICAL FIELD

Exemplary embodiments of the present disclosure relate to a semiconductor memory device, and more particularly, to methods of testing a semiconductor memory device using some of the data pads of the device.

DISCUSSION OF RELATED ART

The capacity and operational speed of semiconductor memory devices have recently been increasing. Manufacturing a semiconductor memory device includes various procedures such as designing, packaging, and testing the device. As the capacity and operational speed of semiconductor memory devices increase, the cost and time associated with testing the devices may also increase.

Parallel testing may be used to increase the speed of the testing process. When parallel testing is used, a plurality of semiconductor memory devices are coupled to a tester and are simultaneously tested. During a parallel test process, a small number of probe pins of the tester may be assigned to each semiconductor memory device. As a result, only some of the data pads or data pins of each semiconductor memory device are coupled to the probe pins in the test mode. As a result, defects associated with the data pads that are not coupled to the tester may not be detected.

SUMMARY

Exemplary embodiments of the present disclosure provide a method of testing a semiconductor memory device using a portion of the data pads of the semiconductor memory device.

In an exemplary embodiment, first data is written into a memory cell array in the semiconductor memory device. The first data is received from an external device through one or more test pads corresponding to a portion of the data pads. Second data on the data pads is rewritten into the memory cell array. The second data corresponds to data that is read out from the memory cell array to the data pads. Test result data is output through the test pads based on the rewritten data in the memory cell array.

Rewriting the second data on the data pads into the memory cell array may include activating a read command signal to read out the second data from the memory cell array to the data pads, and activating a write command signal based on a delay time to rewrite the second data on the data pads into the memory cell array. The delay time corresponds to a time interval occurring between activating the read command signal and loading the second data to the data pads.

A read path of the semiconductor memory device may be enabled based on the read command signal, and a write path of the semiconductor memory device may be enabled based on the write command signal.

Activating the write command signal may include determining an activation timing of the write command signal such that at least a portion of the write path is enabled while at least a portion of the read path is enabled.

Activating the write command signal may include determining an activation timing of the write command signal such that input buffers on the write path are enabled while output drivers on the read path are enabled. Each input buffer and each output driver corresponds to one of the data pads.

The input buffers may temporarily store the second data from the output drivers while both the input buffers and the output drivers are enabled.

The read command signal and the write command signal may be activated internally by a control unit in the semiconductor memory device.

The control unit may be configured to receive a test command signal from an external test device to activate the read command signal and the write command signal based on the test command signal.

Writing the first data into the memory cell array may include switching electrical connections between the data pads and input buffers such that the first data may be provided to all of the input buffers. Each input buffer corresponds to one of the data pads.

Outputting the test result data through the test pads may include rereading the rewritten data in the memory cell array, and generating the test result data by performing a logical operation on the reread data.

An error detection unit in the semiconductor memory device may be configured to generate the test result data by performing the logical operation on the reread data.

Outputting the test result data through the test pads may further include switching electrical connections between the data pads and the error detection unit such that the test result data is output through the test pads.

The semiconductor memory device may be a double data rate synchronous dynamic random access memory (DDR SDRAM) device, or a single data rate synchronous dynamic random access memory (SDR SDRAM) device.

In an exemplary embodiment, a method of testing a semiconductor memory device includes writing first data to a memory cell array in the semiconductor memory device, loading second data from the memory cell array onto a plurality of data pads of the semiconductor memory device, rewriting the second data to the memory cell array, and outputting test result data through one or more test pads. The first data is received from an external device through the one or more test pads, which correspond to one or more of the plurality of data pads. The test result data is based on the rewritten data in the memory cell array.

In an exemplary embodiment, a semiconductor memory device includes a data pad unit including a plurality of data pads, and a memory cell array. The semiconductor memory device is configured to receive first data from an external device via one or more test pads corresponding to one or more of the plurality of data pads, write the first data to the memory cell array, load second data from the memory cell array onto the plurality of data pads, rewrite the second data on the plurality of data pads to the memory cell array, and output test result data based on the rewritten data.

BRIEF DESCRIPTION OF THE DRAWINGS

The above and other features of the present inventive concept will become more apparent by describing in detail exemplary embodiments thereof with reference to the accompanying drawings, in which:

FIG. 16 is a timing diagram illustrating a rewrite operation of a semiconductor memory device in a double data rate (DDR) mode, according to an exemplary embodiment of the present disclosure.

DETAILED DESCRIPTION

Figure 1:
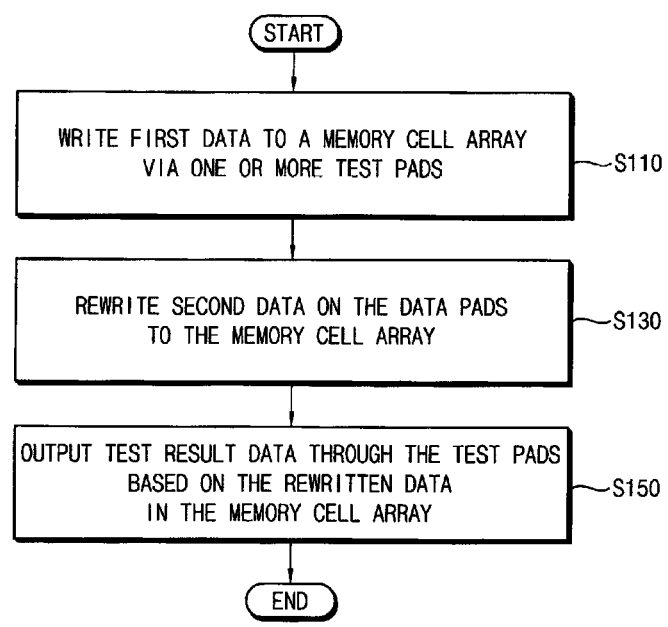
FIG. 1 is a flowchart illustrating a method of testing a semiconductor memory device, according to an exemplary embodiment of the present disclosure.

Exemplary embodiments of the present inventive concept will be described more fully hereinafter with reference to the accompanying drawings. Like reference numerals may refer to like elements throughout the accompanying drawings.

It will be understood that, although the terms first, second, third etc., may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise.

FIG. 1 is a flowchart illustrating a method of testing a semiconductor memory device according to an exemplary embodiment.

Referring to FIG. 1, when testing a semiconductor memory device that includes a plurality of data pads, first data is received from an external device through one or more test pads, and the first data is written into the memory cell array in the semiconductor memory device (S110). One or more of the data pads of the semiconductor memory device may be utilized as the one or more test pads. Second data on the data pads is then rewritten into the memory cell array (S130). The second data correspond to data that is read from the memory cell array and loaded to the data pads. Test result data is output through the test pads based on the rewritten data in the memory cell array (S150). As a result, the data written in the memory cell array may be output to the data pads, and the read data on the data pads may be rewritten into the memory cell array.

When writing the first data into the memory cell array in the semiconductor memory device (S110), the first data may be received from an external device (e.g. an external test device or a tester) through one or more test pads. One or more of the data pads of the semiconductor device may be utilized as the one or more test pads.

A plurality of semiconductor memory devices may be tested simultaneously. To simultaneously couple a plurality of semiconductor memory devices to a test device, a small number of probe pins of the test device is assigned to each of the semiconductor memory devices. During wafer level tests, a parallel bit test (PBT) may be used to determine whether each of the semiconductor memory devices is defective. The semiconductor memory device may be tested by writing the data into the memory cell array, and then reading the data out from the memory cell array. When a write command is input to the semiconductor memory device from the test device, the test data is written into the memory cell array. When a read command is input to the semiconductor memory device from the test device, the data in the memory cell array is read out from the memory cell array, and the read data is checked for errors.

When the semiconductor memory device operates in a normal mode, all of the data pads may be used to transfer data to or from an external device such as, for example, a memory controller. While in a test mode, the test pads may be used to transfer the data to or from an external device such as, for example, a test device. One or more of the data pads of the semiconductor memory device may be utilized as the test pads.

When rewriting second data on the data pads into the memory cell array (S130), the second data may be loaded onto all of the data pads by reading the stored data in the memory cell array. The second data on the data pads may then be rewritten into the memory cell array. The read operation may be performed by activating a read command signal, and the write and/or the rewrite operation may be performed by activating a write command signal. In an exemplary embodiment, when the rewrite operation is performed after the read operation is completed, additional components such as, for example, latches may be used to temporarily store the read data. Alternatively, in an exemplary embodiment, the second data on the data pads may be rewritten into the memory cell array without utilizing additional latches by adjusting the activation timings of the read command signal and the write command signal. Accordingly, when rewriting second data on the data pads into the memory cell array (S130), the read command signal may be activated to read out the second data from the memory cell array to the data pads, and the write command signal may be activated based on a delay time to rewrite the second data on the data pads into the memory cell array. The delay time may correspond to a time interval occurring between activating the read command signal and loading the second data onto the data pads.

When outputting the test result data (S150), the rewritten data in the memory cell array may be reread and processed, and the test result data may be generated. The generated test result data may be provided to the test device through the test pads. The generation and output of the test result data will be further described with reference to FIGS. 7, 12 and 13.

In exemplary embodiments, the reliability of the semiconductor memory device testing process may be increased since the internal data path associated with all of the data pads may be tested by providing the first data (e.g., the test data) through the test pads corresponding to only one or more of the data pads.

Figure 2:
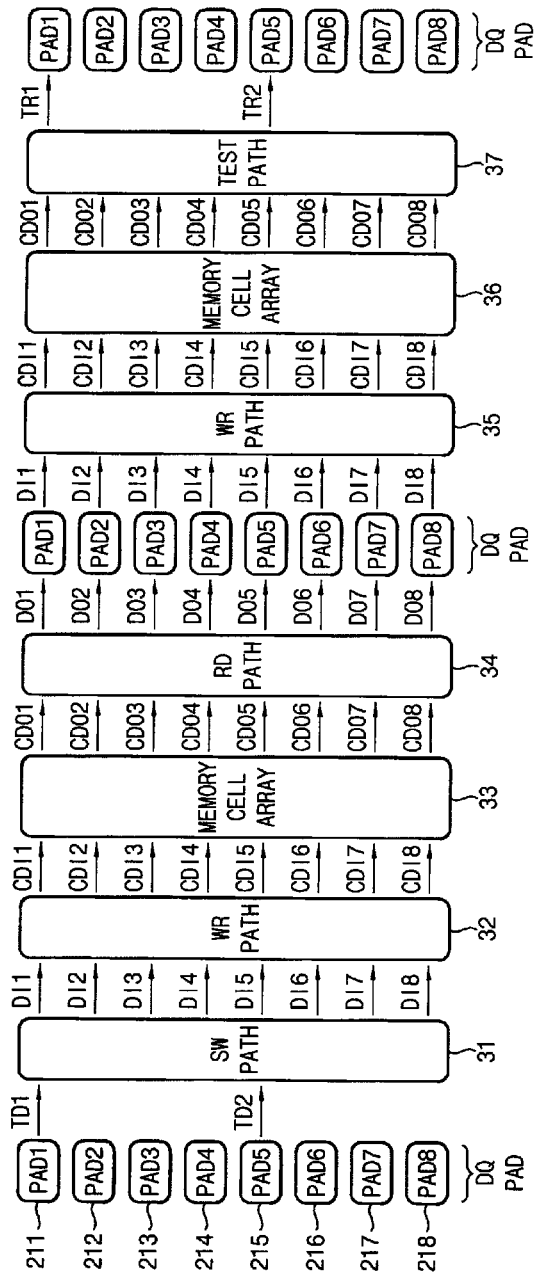
FIG. 2 is a diagram showing the data flow in a semiconductor memory device, according to an exemplary embodiment of the present disclosure.

FIG. 2 is a diagram showing the data flow in a semiconductor memory device, according to an exemplary embodiment.

FIG. 2 illustrates an example of data flow when the semiconductor memory device is tested using two test pads 211 and 215 from among eight data pads 211 through 218. The number of data pads and test pads may be varied depending on the configuration and the test schemes of the semiconductor memory device. The number of test pads is less than the number of data pads.

First data TD1 and TD2 may be provided through the test pads 211 and 215 from an external device such as, for example, a test device. The first data TD1 and TD2 may be written into the memory cell array 33 through a switching path 31 and a write path 32. The data written in the memory cell array 33 is read out as second data and loaded to the data pads 211 through 218 through a read path 34. The second data loaded on the data pads 211 through 218 is rewritten into the memory cell array 36 through a write path 35. Test result data TR1 and TR2 is output via the test pads 211 and 215 through a test path 37 based on the rewritten data in the memory cell array 36. In FIG. 2, the memory cell arrays 33 and 36 refer to the same memory cell array, however the memory cell array may store different data if any error occur during the read and/or write operations.

The first data TD1 and TD2 received through the test pads 211 and 215 may be provided through the switching path 31 to input buffers in the write path 32. Each input buffer corresponds to one of the data pads. As will be described with reference to FIG. 6, the switching path 31 may be configured to distribute the first data TD1 and TD2 to all of the input buffers. As such, the data received through the test pads 211 and 215 may be distributed by the switching path 31 to all of the input buffers while in the test mode. Alternatively, the input data to be provided to the input buffers may be received through the data pads 211 through 218 while in a normal operation mode, as will be described with reference to FIG. 5.

The data DI1 through DI8 from the switching path 31 is input to the write path 32. The write path 32 indicates a path through which the data to be written is transferred from the switching path 31 to the memory cell array 33. The write path 32 may include, for example, the input buffers buffering the received data DI1 through DI8, signal lines, and write drivers driving bit lines in the memory cell array 33. If defects exist in the write path 32, the data DI1 through DI8 input to the write path 32 may be different from the data CDI1 through CDI8 output from the write path 32.

The data CD01 through CD08 read out from the memory cell array 33 is input to the read path 34. The read path 34 indicates a path through which the read data is transferred from the memory cell array 33 to the data pads 211 through 218. The read path 34 may include, for example, output drivers driving the data pads 211 through 218, signal lines, and sense amplifiers. If defects exist in the read path 34, the data CD01 through CD08 input to the read path 34 may be different from the data D01 through D08 output from the read path 34. The second data loaded on the data pads 211 through 218, data DI1-DI8, is input again to the write path 35, and the data CDI1 through CDI8 from the write path 35 is rewritten into the memory cell array 36.

When testing the semiconductor memory device, the first data TD1 and TD2 is provided through the test pads 211 and 215. Two of the data pads 211 through 218 may be utilized as the test pads 211 and 215. Testing the data path corresponding to the data pads 212, 213, 214, 216, 217 and 218 that are unused in the test mode may not be practical. In an exemplary embodiment, the data stored in the memory cell array may be read out and loaded to all of the data pads 211 through 218, and the data on the data pads 211 through 218 may be rewritten into the memory cell array. As a result, the method of testing the semiconductor memory device may be performed with respect to the entire data path using only the test data provided through the test pads 211 and 215.

The rewritten data in the memory cell array 36 is read out and the read data CD01 through CD08 is input to the test path 37. The test path 37 may include, for example, an error detection unit that detects errors in the data CD01 through CD08, and generates the test result data TR1 and TR2. The test result data TR1 and TR2 is provided to the external device through the test pads 211 and 215.

FIG. 2 illustrates two test pads 211 and 215 from among the eight data pads 211 through 218, however the number of test pads and data pads is not limited thereto. For example, the number of data pads may be 16, 32, or 64, and may be based on the configuration of the memory cell array. The number of test pads may be any number smaller than the number of data pads, and may be based on the test scheme.

Figure 3:
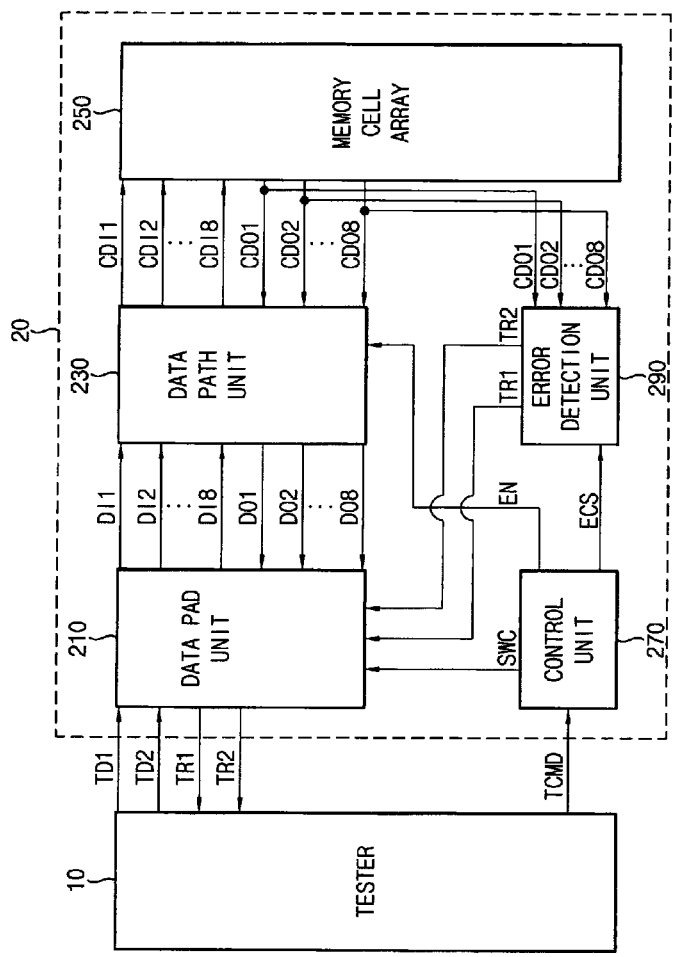
FIG. 3 is a block diagram illustrating a system for testing a semiconductor memory device, according to an exemplary embodiment of the present disclosure.

FIG. 3 is a block diagram illustrating a system for testing a semiconductor memory device, according to an exemplary embodiment.

Referring to FIG. 3, the system includes a tester 10 and a semiconductor memory device 20 operatively coupled to the tester 10. The semiconductor memory device 20 may include, for example, a data pad unit 210, a data path unit 230, a memory cell array 250, a control unit 270 and an error detection unit 290. In the exemplary embodiment shown in FIG. 3, test data TD1 and test data TD2 is provided through two test pads from among eight data pads of the semiconductor memory device 20.

The tester 10 may generate test data TD1 and TD2, which is provided to the test pads in the data pad unit 210. As discussed above, one or more of the data pads in the data pad unit 210 may be utilized as the test pad(s). The data pad unit 210 distributes the test data TD1 and TD2 and provides eight pieces of data DI1 through DI8 to the data path unit 230. The data CDI1 through CDI8 output from the data path unit 230 is written into the memory cell array 250. The data stored in the memory cell array 250 is read out to the data pads in the data pad unit 210 through a read path in the data path unit 230 in response to a read command signal. In parallel with this read operation, the read data on the data pads may be rewritten into the memory cell array 250 through a write path in the data path unit 230 in response to a write command signal. The rewritten data is provided to the error detection unit 290, and the error detection unit 290 generates the test result data TR1 and TR2 based on the input data CD01 through CD08 corresponding to the rewritten data. The generated test result data TR1 and TR2 is input to the data pad unit 210 and provided to the tester 10 through the test pads in the data pad unit 210. As a result, the semiconductor memory device 20 testing process may be performed with respect to the entire read and write paths using only the test data TD1 and TD2 provided through the test pads.

The tester 10 may be operatively coupled to the semiconductor memory device 20 to be tested, and may provide a test command signal TCMD and the test data TD1 and TD2 to the semiconductor memory device 20. The test command signal TCMD may control the semiconductor memory device 20 in the test mode. In addition, the tester 10 may receive the test result data TR1 and TR2 and determine whether the semiconductor memory device 20 has failed the testing process based on the test result data TR1 and TR2.

The data pad unit 210 receives the test data TD1 and TD2 from the tester 10. The data pad unit 210 may include the data pads 211 through 218 and a switching unit, as will be described with reference to FIGS. 4 through 7. The switching unit may switch electrical connections between the data pads 211 through 218 and input buffers such that the test data TD1 and TD2 is provided to all of the input buffers. The data path unit 230 may include, for example, eight input buffers corresponding to the eight data pads. The eight input buffers may respectively buffer the data provided through the eight data pads 211 through 218 while in the normal operation mode. The switching unit may switch electrical connections between the data pads 211 through 218 and the error detection unit 290 such that the test result data TR1 and TR2 may be output through the test pads 211 and 215. The operation of the switching unit will be further described with reference to FIGS. 4 through 7.

The data path unit 230 may include a write path and a read path between the data pad unit 210 and the memory cell array 250. As described with reference to FIG. 2, the write path indicates a path through which the data DI1 through DI8 are transferred to the memory cell array 250, and the read path indicates a path through which the data CD01 through CD08 from the memory cell array 250 is transferred to the data pad unit 210. The write path and the read path in the data path unit 230 will be further described with reference to FIGS. 8 through 11.

In an exemplary embodiment, the write operation may be performed twice. For example, a write operation may first be performed based on the first data that corresponds to the test data TD1 and TD2 provided from the tester 10 through the test pads 211 and 215, and a rewrite operation may then be performed based on second data that correspond to the data read out from the memory cell array 250 and loaded to all of the data pads 211 through 218 in the data path unit 210. The rewritten data in the memory cell array 250 is reread and provided to the error detection unit 290, and the test result data TR1 and TR2 is generated.

The control unit 270 generates a control signal that controls the operation of the semiconductor memory device 20. The control signal may include, for example, a switching control signal SWC that controls the switching operation of the data pad unit 210, an enable signal EN that controls activation of the data path unit 230, and an error detection control signal ECS that controls the error detection unit 290. In the test mode, the test command signal TCMD may be applied to the semiconductor memory device 20, and the control unit 270 may generate the control signal based on the test command signal TCMD. The read command signal and the write command signal may be activated internally by the control unit 270. As will be described with reference to FIGS. 15 and 16, the control unit 270 may determine the activation timings of the read command signal and the write command signal. Alternatively, the read command signal and the write command signal may be provided from the tester 10, and the tester 10 may determine the activation timings of the read command signal and the write command signal.

In an exemplary embodiment, the control unit 270 may include a mode register set (MRS). A test MRS code may be generated in response to the test command signal TCMD.

The error detection unit 290 may generate the test result data TR1 and TR2 based on the rewritten data in the memory cell array 250. The test result data TR1 and TR2 is provided to the tester 10 through the test pads. For example, the error detection unit 290 may perform an exclusive-NOR logic operation on the rewritten data to generate the test result data TR1 and TR2, as will be described with reference to FIG. 13.

Figure 4:
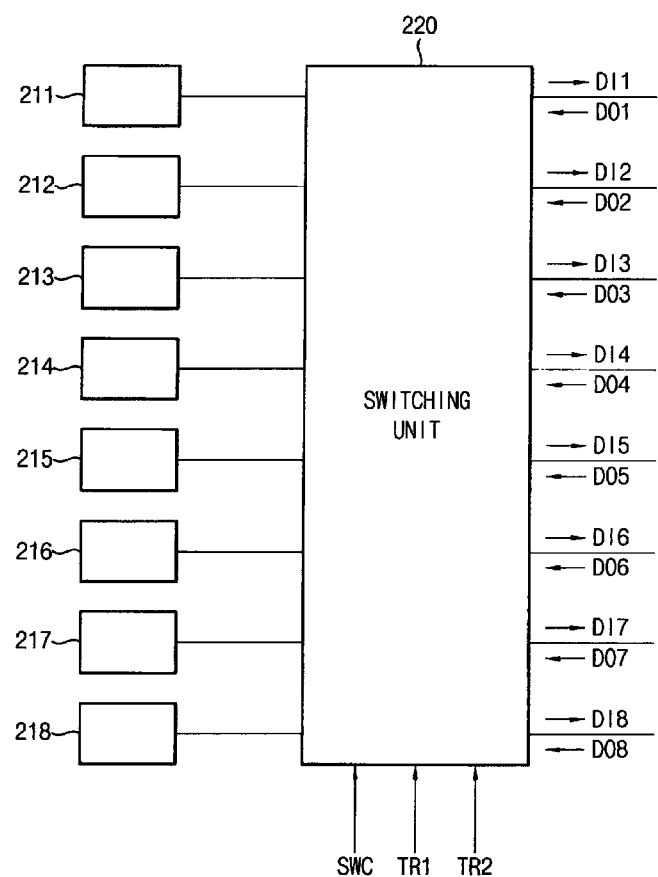
FIG. 4 is a diagram illustrating a data pad unit in the semiconductor memory device shown in FIG. 3, according to an exemplary embodiment of the present disclosure.

FIG. 4 is a diagram illustrating a data pad unit in the semiconductor memory device shown in FIG. 3, according to an exemplary embodiment.

Referring to FIG. 4, the data pad unit 210 may include a plurality of data pads 211 through 218 and a switching unit 220. As described above, the number of data pads is not limited to eight, and may be varied according to the configuration of the semiconductor memory device 20. One or more of the data pads 211 through 218 may be utilized as the test pads that are coupled to the tester 10 in the test mode. For example, the two data pads 211 and 215 may be utilized as the test pads receiving test data TD1 and TD2, as described above. In an exemplary embodiment, the other data pads 212, 213, 214, 216, 217 and 218 may not be coupled to the tester 10 in the test mode. In the normal operation mode, all of the data pads 211 through 218 may be coupled to an external device such as, for example, a memory controller, and may transfer data. The input data DI1 through DI8 and the output data DO1 through DO8 may be transferred through the respective data pads 211 through 218 in the normal operation mode, and the test pads 211 and 215 may be used to transfer the test data in the test mode. The switching unit 220 may control electrical connections to the data pads 211 through 218 in response to the switching control signal SWC.

Figure 5:
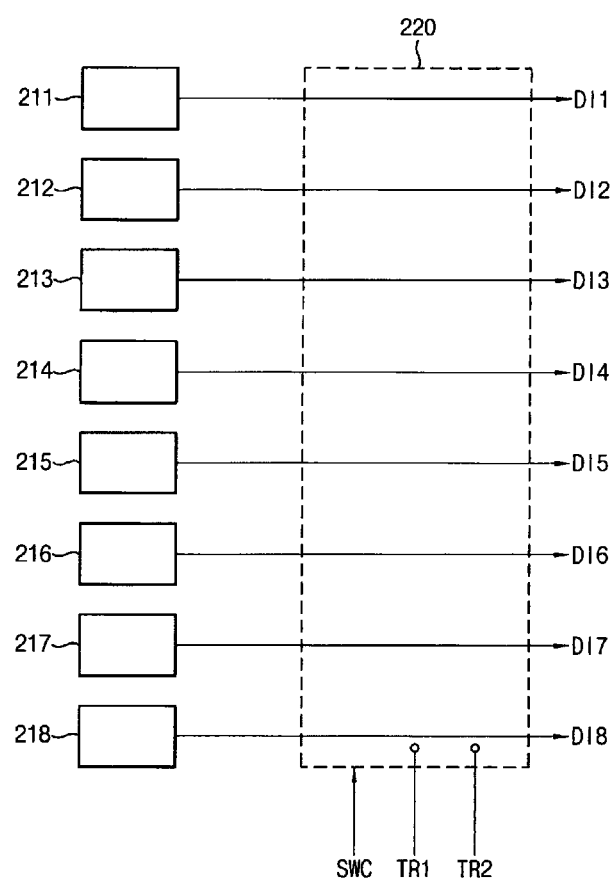
FIGS. 5, 6 and 7 are diagrams illustrating a switching operation of the data pad unit shown in FIG. 4, according to exemplary embodiments of the present disclosure.
Figure 6:
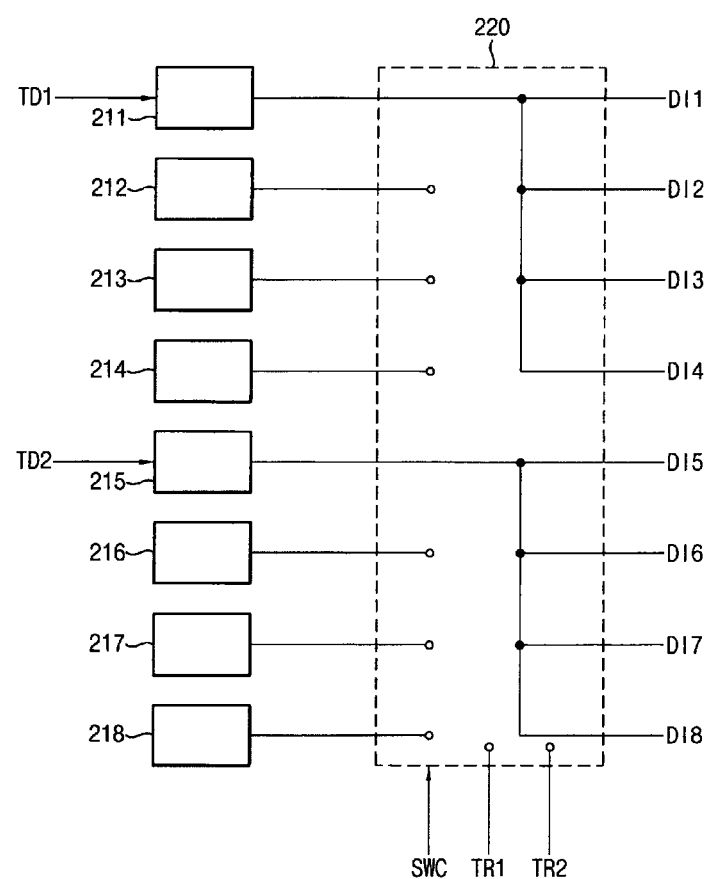
Figure 7:
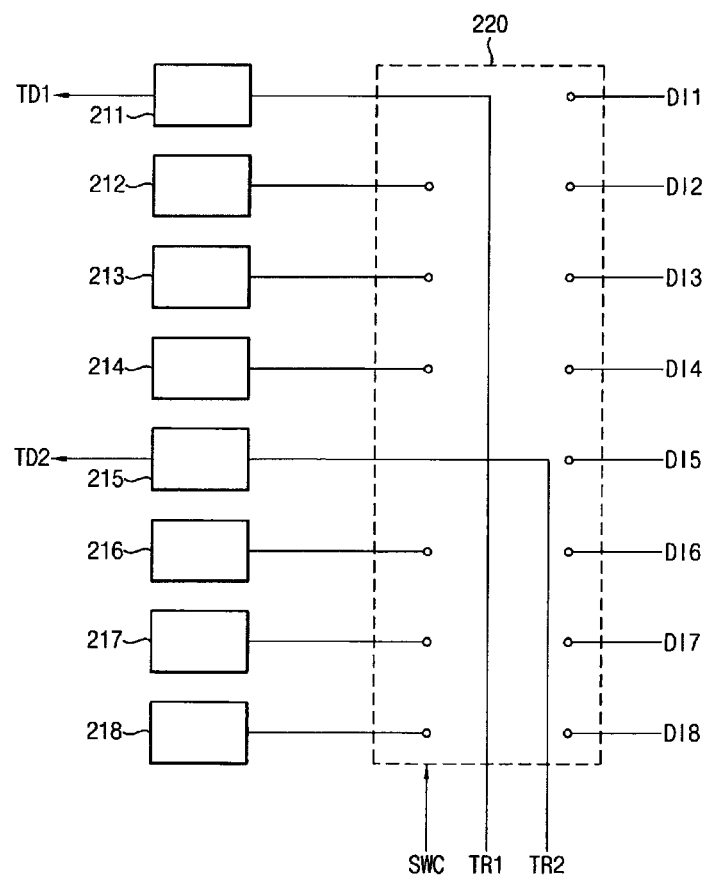

FIGS. 5, 6 and 7 are diagrams illustrating a switching operation of the data pad unit of FIG. 4, according to an exemplary embodiment.

FIG. 5 illustrates the electrical connections of the switching unit 220 in the normal operation mode. When the semiconductor memory device 20 performs the write operation, the data DI1 through DI8 may be provided through all of the data pads 211 through 218. In this case, the switching unit 220 may be set to couple the data pads 211 through 218 to the terminals of the data path unit 230, respectively, such that the data DI1 through DI8 from all of the data pads 211 through 218 may be transferred to the data path unit 230, respectively. In the normal operation mode, the input terminals of the test result data TR1 and TR2 may be disconnected from the data pads 211 through 218.

The operation of the switching unit 220 may be controlled in response to the switching control signal SWC. In an exemplary embodiment, the switching unit 220 may include multiplexers and/or demultiplexers capable of controlling the electrical connection to the data pads 211 through 218 in response to the switching control signal SWC. As such, in the normal write operation mode, as shown in FIG. 5, the data DI1 through DI8 may be provided to the input buffers in the data path unit 230 through the switching unit 220. The input buffers in the data path unit 230 will be described with reference to FIG. 9.

FIG. 5 illustrates the electrical connections of the switching unit 220 in the normal write operation mode. The switching unit 220 may have similar connections in the normal read operation mode, such that the data from the data path unit 230 may be respectively transferred to the data pads 211 through 218.

FIG. 6 illustrates the electrical connections of the switching unit 220 when the test data TD1 and TD2 received through the test pads 211 and 215 is distributed to all of the input buffers in the data path unit 230. As described above, the two test pads 211 and 215 may be coupled to the tester 10 and receive the test data TD1 and TD2. The distributed data DI1 through DI8 may be provided to the input buffers in the data path unit 230. The switching unit 220 may control the electrical connections between the data pads 211 and 218 and the input buffers in response to the switching control signal SWC, as illustrated in FIG. 6. In this case, the data DI1 through DI4 may be the same as test data TD1, and the data DI5 through DI8 may be the same as test data TD2.

FIG. 7 illustrates the electrical connections of the switching unit 220 when the test result data TR1 and TR2 are provided to the tester 10 through the test pads 211 and 215 coupled to the tester 10 in the test mode. The test result data TR1 and TR2 may be provided from the error detection unit 290. As such, the switching unit 220 may control the electrical connections between the data pads 211 and 218 and the error detection unit 290 in response to the switching control signal SWC, such that the test result data TR1 and TR2 may be output through the test pads 211 and 215. The switching control signal SWC may include a plurality of bits that indicate the plurality of connections as illustrated in FIGS. 5, 6 and 7.

Figure 8:
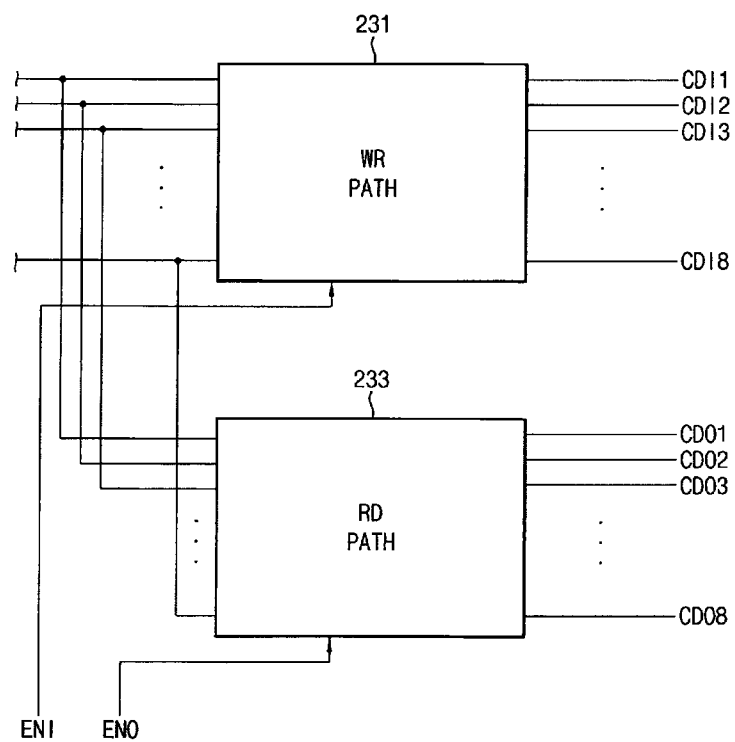
FIG. 8 is a block diagram illustrating a data path unit in the semiconductor memory device shown in FIG. 3, according to an exemplary embodiment of the present disclosure.

FIG. 8 is a block diagram illustrating a data path unit in the semiconductor memory device in FIG. 3, according to an exemplary embodiment.

Referring to FIGS. 3 and 8, the data path unit 230 may include a write path 231 and a read path 233. The write path 231 may be enabled based on a write command signal, and the read path 233 may be enabled based on a read command signal. The write path 231 may include elements such as, for example, buffers, drivers, and signal lines through which the data from the data pad unit 210 is transferred to the memory cell array 250. At least a portion of the write path 231 may be controlled by an input enable signal ENI received from the control unit 270. The read path 233 may include elements such as, for example, buffers, drivers, and signal lines through which the data from the memory cell array 250 is transferred to the data pad unit 210. At least a portion of the read path 233 may be controlled by an output enable signal EN0 received from the control unit 270. In the normal operation mode, the control unit 270 may activate the input enable signal ENI and deactivate the output enable signal EN0 when the write command signal is activated, and the control unit 270 may activate the output enable signal EN0 and deactivate the input enable signal ENI when the read command signal is activated. As such, collision of the read data and the write data may be avoided by alternatively activating the write path 231 and the read path 233 in the normal operation mode. In the test operation mode according to an exemplary embodiment, an activation timing of the write command signal may be determined such that input buffers on the write path 231 are enabled while output drivers on the read path 233 are enabled for the rewrite operation, as will be described further below.

Figure 9:
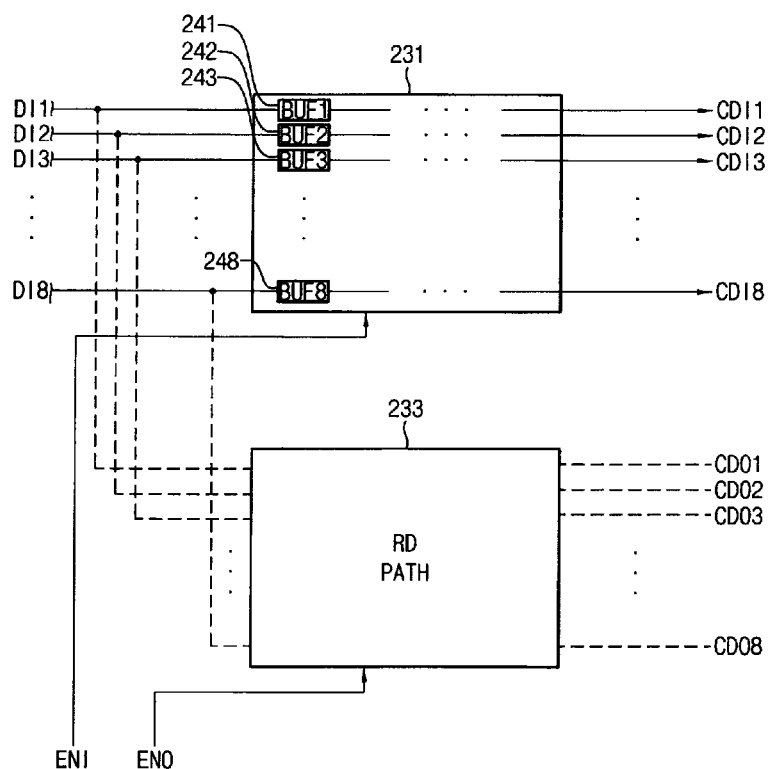
FIGS. 9, 10 and 11 are diagrams illustrating operations of the data path unit shown in FIG. 8, according to exemplary embodiments of the present disclosure.
Figure 10:
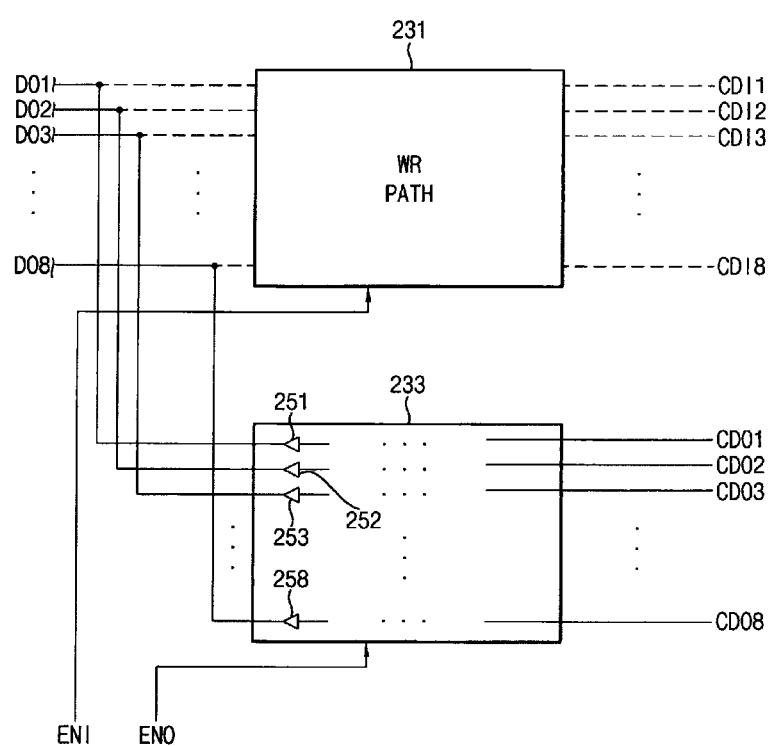
Figure 11:
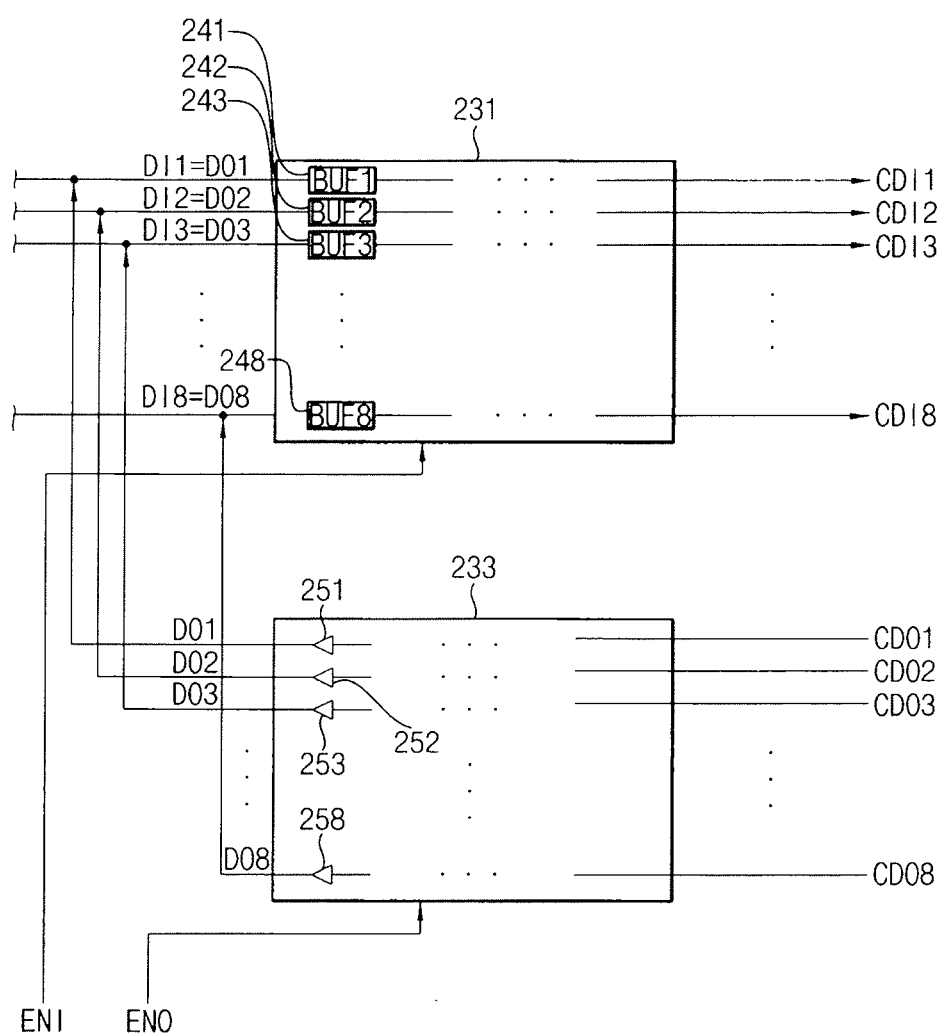

FIGS. 9, 10 and 11 are diagrams showing an operation of the data path unit of FIG. 8, according to an exemplary embodiment.

FIG. 9 illustrates the normal write operation mode of the data path unit 230, according to an exemplary embodiment. The write path 231 in the data path unit 230 may include, for example, a plurality of input buffers 241 through 248 respectively corresponding to the data pads 211 through 218. In the normal write operation mode, the input enable signal ENI is activated and the output enable signal EN0 is deactivated by the control unit 270. Accordingly, the write path 231 is enabled and the read path 233 is disabled. The data path associated with the disabled read path 233 is represented by the dotted lines in FIG. 9. The input buffers 241 through 248 may receive the input data DI1 through DI8 in response to the input enable signal ENI, which is activated in response to the write command signal. Thus, the data CDI1 through CDI8 transferred through the write path 231 may be written into the memory cell array 250.

FIG. 10 illustrates the normal read operation mode of the data path unit 230, according to an exemplary embodiment. The read path 233 in the data path unit 230 may include, for example, a plurality of output drivers 251 through 258 respectively corresponding to the data pads 211 through 218. In the normal read operation mode, the input enable signal ENI is deactivated and the output enable signal EN0 is activated by the control unit 270. Accordingly, the read path 233 is enabled and the write path 231 is disabled. The data path associated with the disabled write path 231 is represented by the dotted lines in FIG. 10. The output drivers 251 through 258 may output the data CD01 through CD08 from the memory cell array 250 to the data pads 211 through 218 in response to the output enable signal EN0, which is activated in response to the read command signal.

FIG. 11 illustrates the rewrite operation mode of the data path unit 230, according to an exemplary embodiment. In FIG. 11, the data CD01 through CD08 read out from the memory cell array 250 is loaded onto the data pads 211 through 218, and then the data DI1 through DI8, which is the same as the loaded data D01 through D08, is rewritten into the memory cell array 250. To read out the data CD01 through CD08 from the memory cell array 250, the control unit 270 activates the output enable signal EN0 in response to the activated read command signal. The read path 233 is enabled in response to the activated output enable signal EN0, and the read data CD01 through CD08 may be provided to the data pads 211 through 218. To rewrite the data DI1 through DI8, which is the same as the data D01 through D08 loaded on the data pads 211 through 218, the control unit 270 activates the input enable signal ENI in response to the activated write command signal. The write path 231 is enabled in response to the activated input enable signal ENI, and the data CDI1 through CDI8 are rewritten into the memory cell array 250.

In the normal write operation mode, the write command signal is activated after the read operation has been completed. For example, to avoid a collision between the read data and the write data, the write command signal may not be activated until the read data is transferred to the memory controller through the data pads.

Alternatively, in an exemplary embodiment, at least a portion of the write path 231 may be enabled while at least a portion of the read path 233 is enabled, and the data loaded on the data pads 211 through 218 may be rewritten into the memory cell array 250. For example, the activation timing of the write command signal may be set such that input buffers 241 through 248 on the write path 231 are enabled while the output drivers 251 through 258 on the read path 233 are enabled. As a result, the input buffers 241 through 248 and the output drivers 251 through 258 coupled to the data pads 211 through 218 may be simultaneously enabled to rewrite the read data directly into the memory cell array 250. In an exemplary embodiment, the input buffers 241 through 248 may temporarily store the data from the output drivers 251 through 258 while both the input buffers 241-248 and the output drivers 251-258 are enabled. As a result, the rewrite operation may be associated with the entire data path between the memory cell array 250 and all of the data pads 211 through 218, and may be performed without additional latches used during the test operation.

In an exemplary embodiment, the data may be loaded onto the data pads 211 through 218 of the semiconductor memory device 20 based on a delay time corresponding to a time elapsing after the read command signal has been activated. The delay time may be varied according to operational characteristics of the semiconductor memory device 20. To use the loaded data on the data pads 211 through 218 as the input data for the rewrite operation, the activation timing of the write command signal is first determined. For example, the read command signal may be activated to read out the second data from the memory cell array 250 to the data pads 211 through 218, and then the write command signal may be activated based on a delay time to rewrite the second data on the data pads 211 through 218 into the memory cell array 250. In this example, the delay time corresponds to a time interval occurring between activating the read command signal and loading the second data to the data pads 211 through 218. Activation timing will be further described with reference to FIGS. 14, 15 and 16.

Figure 12:
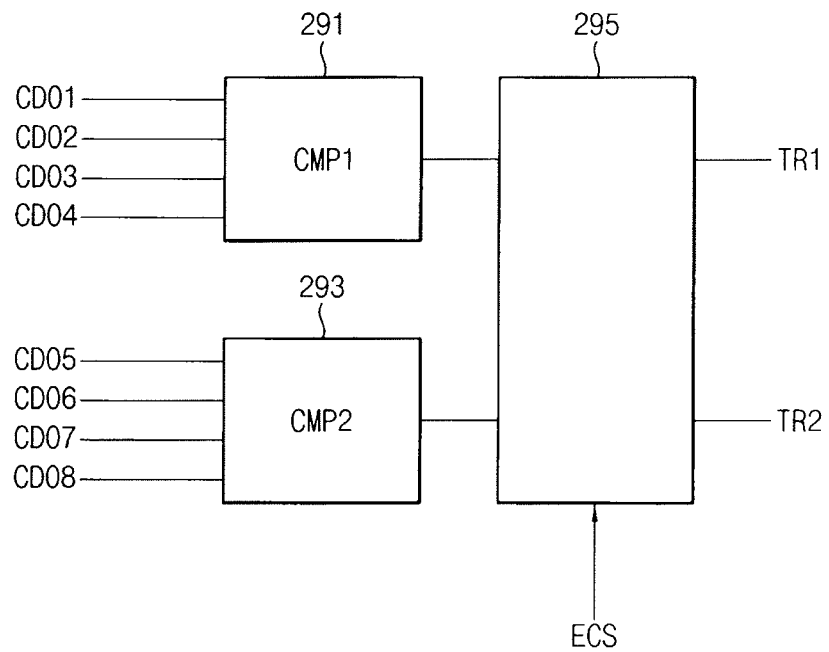
FIG. 12 is a block diagram illustrating an error detection unit in the semiconductor memory device shown in FIG. 3, according to an exemplary embodiment of the present disclosure.

FIG. 12 is a block diagram illustrating an error detection unit in the semiconductor memory device in FIG. 3, according to an exemplary embodiment.

As described with reference to FIG. 3, the error detection unit 290 may generate the test result data TR1 and TR2 based on the rewritten data CD01 through CD08 in the memory cell array 250, and provide the test result data TR1 and TR2 to the data pad unit 210.

Referring to FIG. 12, the error detection unit 290 may include, for example, a first comparison unit 291, a second comparison unit 293, and an output unit 295. The first comparison unit 291 may detects any errors in the data CD01 through CD04 rewritten in the memory cell array 250, and the second comparison unit 293 may detect any errors in the data CD05 through CD08 rewritten in the memory cell array 250. The output unit 295 outputs the test result data TR1 and TR2 in response to an error detection control signal ECS. The output timing of the test result data TR1 and TR2 may be controlled by the error detection control signal ECS received from the control unit 270.

The semiconductor memory device 20 may reread the rewritten data in the memory cell array 250, and the error detection unit 290 may generate the test result data TR1 and TR2 by performing a logical operation on the reread data CD01 through CD08. The test result data TR1 and TR2 is provided to the switching unit 220 in the data pad unit 210, and the switching unit 220 may switch the electrical connections between the data pads 211 through 218 and the error detection unit 290, such that the test result data TR1 and TR2 may be output to the tester 10 through the test pads 211 and 215, as described above.

In an exemplary embodiment, the write operation is performed twice. For example, the write operation may first be performed based on the first data that corresponds to the test data TD1 and TD2 provided from the tester 10 through the test pads 211 and 215, and the rewrite operation may then be performed based on second data that corresponds to the data read out from the memory cell array 250 and loaded to the data pads 211 through 218. The rewritten data in the memory cell array 250 is reread and provided to the error detection unit 290, and the test result data TR1 and TR2 is generated. As a result, the entire data path may be tested using the test pads 211 and 215.

Figure 13:
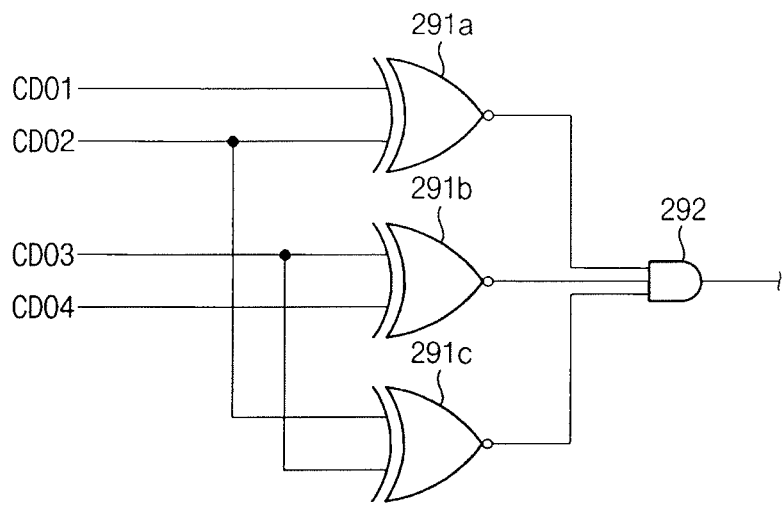
FIG. 13 is a circuit diagram illustrating a comparison unit in the error detection unit shown in FIG. 12, according to an exemplary embodiment of the present disclosure.

FIG. 13 is a circuit diagram illustrating a first comparison unit in the error detection unit of FIG. 12, according to an exemplary embodiment.

Referring to FIG. 13, the first comparison unit 291 may include, for example, a first exclusive NOR (XNOR) logic gate 291a, a second XNOR logic gate 291b, a third XNOR logic gate 291c and an AND logic gate 292. The first XNOR logic gate 291a performs an)(NOR logic operation on the data CD01 and CD02. The second XNOR logic gate 291b performs an XNOR logic operation on the data CD03 and CD04. The third)(NOR logic gate 291c performs an)(NOR logic operation on the data CD02 and CD03. The AND logic gate performs an AND logic operation on the outputs of the) (NOR logic gates 291a, 291b and 291c.

When the data CD01 through CD04 is originated from the common data TD1 as discussed above, and the read and write paths associated with the data pads 211 through 218 have no errors, the four pieces of data CD01 through CD04 have the same logic values. The first comparison unit 291 generates an output signal having a high logic value (e.g., "1") when the four pieces of data CD01 through CD04 have the same logic values, and an output signal having a low logic value (e.g., "0") when at least one of the four pieces of data CD01 through CD04 is different from the other data pieces. As a result, the test result data TD1 may be generated to detect any errors in the data CD01 through CD04.

The second comparison unit 293 may have a similar configuration to that of the first comparison unit 291 as shown in FIG. 13, and may detect any errors in the data CD05 through CD08.

The configuration of the first and second comparison units 291 and 293 is not limited to the exemplary embodiment shown in FIG. 13. For example, in an exemplary embodiment, the three XNOR logic gates 291a, 291b and 291c may be replaced with three OR logic gates, and the AND logic gate 292 may be replaced with an OR logic gate. In this embodiment, the first comparison unit 291 generates an output signal having a low logic value (e.g., "0") when the four pieces of data. CD01 through CD04 have the same logic value, and an output signal having a high logic value (e.g., "1") when at least one of the four pieces of data CD01 through CD04 is different from the other pieces of data.

Figure 14:
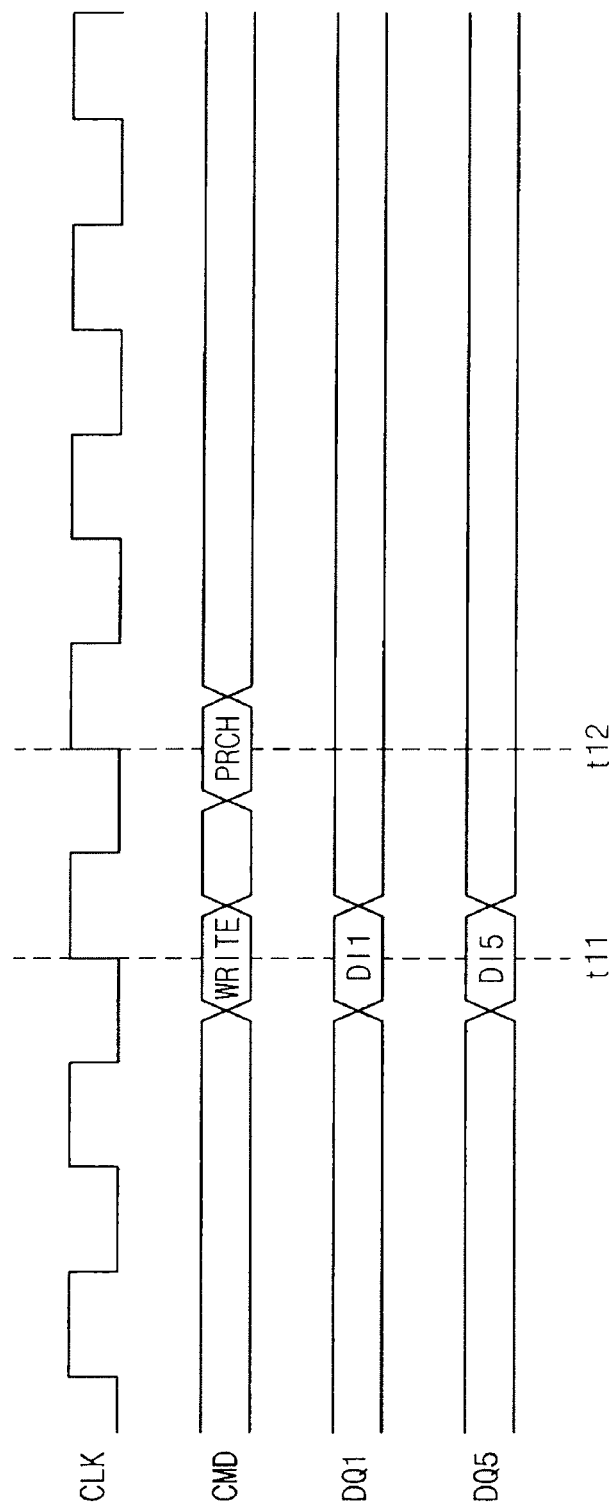
FIG. 14 is a timing diagram illustrating a write operation of a semiconductor memory device in a single data rate (SDR) mode, according to an exemplary embodiment of the present disclosure.

FIG. 14 is a timing diagram illustrating a write operation of a semiconductor memory device in a single data rate (SDR) mode, according to an exemplary embodiment.

Referring to FIG. 14, the semiconductor memory device 20 may perform a normal write operation in synchronization with a rising edge of a clock signal CLK while in an SDR mode. At time t11, a write command signal WRITE is activated as an operation command CMD, test data DI1 is input to a first data pin DQ1, and test data DI5 is input to a fifth data pin DQ5. The first and fifth data pins DQ1 and DQ5 correspond to the above-mentioned test pads 211 and 215. In FIG. 14, the burst length is one, however the burst length is not limited thereto. After the write operation is completed, the precharge command signal PRCH is activated to initialize the data path.

Hereinafter, rewrite operations according to an exemplary embodiment are described with reference to FIGS. 15 and 16. The semiconductor memory device may have a configuration that operates in one of a single data rate (SDR) mode and a double data rate (DDR) mode, or the semiconductor memory device may have a configuration that selectively operates in the SDR mode or the DDR mode according to the operational scheme.

Figure 15:
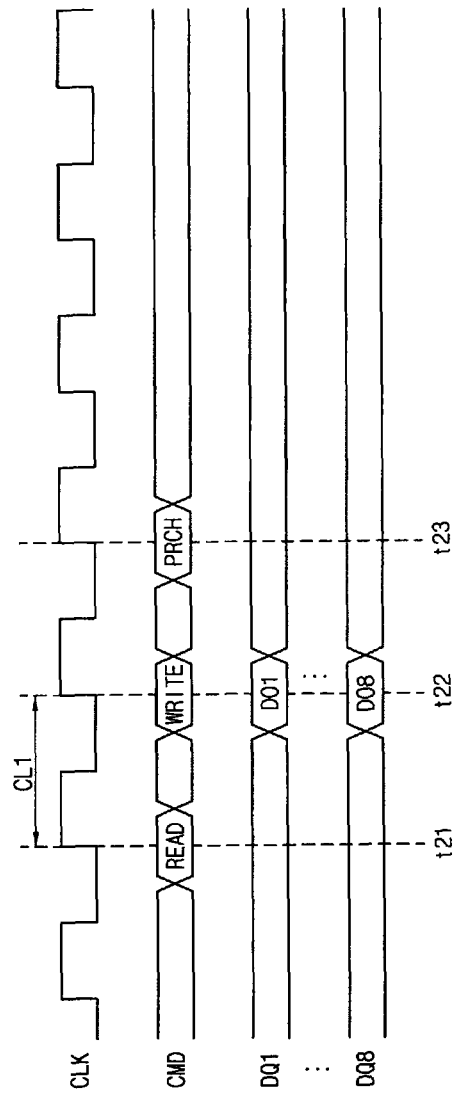
FIG. 15 is a timing diagram illustrating a rewrite operation of a semiconductor memory device in an SDR mode, according to an exemplary embodiment of the present disclosure.

FIG. 15 is a timing diagram illustrating a rewrite operation of a semiconductor memory device in an SDR mode, according to an exemplary embodiment.

Referring to FIG. 15, the delay time CL1 corresponding to a time interval occurring between activating the read command signal READ and loading the second data to the data pads is one clock cycle, and the burst length is one.

According to an exemplary embodiment, when the read command signal READ is activated, the second data D01 through D08 is read out from the memory cell array 250 to all of the data pads DQ1 through DQ8. When the write command signal WRITE is activated based on the delay time CL1, the second data D01 through D08 is rewritten on the data pads DQ1 through DQ8 into the memory cell array 250. As mentioned above, the delay time corresponds to a time interval occurring between activating the read command signal READ and loading the second data D01 through D08 to the data pads DQ1 through DQ8.

The read command signal READ is activated at time t21 and the data stored in the memory cell array 250 is read out. After the delay time CL1, the read data D01 through D08 is loaded to the data pads DQ1 through DQ8 at time t22. At this time, the write command signal WRITE is activated and the data D01 through D08 is rewritten in the memory cell array 250. As a result, the data D01 through D08, which is read out from the memory cell array 250 and loaded to the data pads DQ1 through DQ8, is directly written back into the memory cell array 250. Once the rewrite operation has completed, the precharge command signal PRCH is activated to initialize the data path.

FIG. 16 is a timing diagram illustrating a rewrite operation of a semiconductor memory device in a DDR mode, according to an exemplary embodiment.

Referring to FIG. 16, the delay time CL4 corresponding to a time interval occurring between activating the read command signal READ and loading the second data to the data pads is four clock cycles, and the burst length is four. The burst length indicates the amount of data that is read out from or written into the memory cell array based on one read or write command signal. The input and output of the data may be performed in synchronization with a rising edge and a falling edge of the data strobe signal DQS in the DDR mode.

According to an exemplary embodiment, when the read command signal READ is activated, the second data D01 through D08 is read out from the memory cell array 250 to all of the data pads DQ1 through DQ8. When the write command signal WRITE is activated based on the delay time CL4, the second data D01 through D08 is rewritten on the data pads DQ1 through DQ8 into the memory cell array 250. As discussed above, the delay time corresponds to a time interval occurring between activating the read command signal READ and loading the second data D01 through D08 to the data pads DQ1 through DQ8.

The read command signal READ is activated at time t31 and the data stored in the memory cell array 250 is read out. After the delay time CL4, the read data D01 through D08 is loaded to the data pads DQ1 through DQ8 at time t33. Since the burst length is four, four pieces of data are read out per each data pad. Based on the delay time CL4, when write command signal WRITE is activated, the data D01 through D08 is rewritten in the memory cell array 250. The write command signal WRITE may be activated at time t32 before time t33 as a result of a latency tdm that exists between the activation of the write command signal WRITE and the activation of the data strobe signal DQS. At time t34, the loaded data D01 through D08 is rewritten into the memory cell array 250 in synchronization with the edges of the data strobe signal DQS. The rewrite operation is completed at time t35 and the precharge command signal PRCH is activated at time t36, and the data path is initialized. As a result, the data D01 through D08, which is read out from the memory cell array 250 and loaded to the data pads DQ1 through DQ8, is directly written again into the memory cell array 250.

In the normal write operation mode, to avoid a collision of the read and write data, the write command signal is not activated until the read operation has completed. In the rewrite operation mode in an exemplary embodiment, the write command signal may be activated before the read operation has completed. For example, the write command signal WRITE may be activated before the precharge signal PRCH is activated, as illustrated in FIGS. 15 and 16. The activation timing of the write command signal WRITE may be determined based on the delay time CL1 or CL4, which corresponds to a time interval occurring between activating the read command signal and loading the second data to the data pads.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A method of testing a semiconductor memory device, comprising:
    writing first data to a memory cell array in the semiconductor memory device, wherein the first data is received from an external device through one or more test pads, and the one or more test pads correspond to one or more of a plurality of data pads of the semiconductor memory device;
    loading second data from the memory cell array onto the plurality of data pads;
    rewriting the second data on the plurality of data pads to the memory cell array; and
    outputting test result data through the test pads based on the rewritten data in the memory cell array,
    wherein at least a portion of a write path of the semiconductor memory device is enabled while at least a portion of a read path of the semiconductor memory device is enabled in response to an activation timing of a write command signal.

2. The method of claim 1, wherein writing the first data to the memory cell array comprises:
    providing the first data to a plurality of input buffers in a write path of the semiconductor memory device, wherein each input buffer corresponds to one of the plurality of data pads, and the first data is provided to the input buffers by switching electrical connections between the input buffers and the data pads.

3. The method of claim 1, wherein outputting the test result data comprises:
    rereading the rewritten data in the memory cell array; and
    generating the test result data based on a logical operation performed on the reread data.

4. The method of claim 1, wherein the semiconductor memory device is a double data rate synchronous dynamic random access memory (DDR SDRAM) device.

5. The method of claim 1, wherein the semiconductor memory device is a single data rate synchronous dynamic random access memory (SDR SDRAM) device.

6. The method of claim 1, further comprising:
transmitting data through the plurality of data pads to a memory controller while in a normal mode; and
transmitting test data through the test pads to a test device while in a test mode.

7. A method of testing a semiconductor memory device, comprising:
writing first data to a memory cell array in the semiconductor memory device, wherein the first data is received from an external device through one or more test pads, and the one or more test pads correspond to one or more of a plurality of data pads of the semiconductor memory device;
loading second data from the memory cell array onto the plurality of data pads;
rewriting the second data on the plurality of data pads to the memory cell array; and
outputting test result data through the test pads based on the rewritten data in the memory cell array,
wherein rewriting the second data on the plurality of data pads comprises:
loading the second data from the memory cell array onto the data pads in response to activating a read command signal; and
rewriting the second data on the plurality of data pads to the memory cell array in response to activating a write command signal, wherein the write command signal is based on a delay time, and the delay time corresponds to a time interval occurring between receiving the read command signal and loading the second data onto the plurality of data pads.

8. The method of claim 7, further comprising:
enabling a read path of the semiconductor memory device based on the read command signal; and
enabling a write path of the semiconductor memory device based on the write command signal.

9. The method of claim 8, wherein activating the write command signal is based on an activation timing, and at least a portion of the write path is enabled while at least a portion of the read path is enabled in response to the activation timing.

10. The method of claim 8, wherein determining a timing of the activation of the write command signal comprises:
enabling input buffers on the write path while output drivers on the read path are enabled, wherein each input buffer and each output driver corresponds to one of the plurality of data pads.

11. The method of claim 10, wherein the input buffers are configured to temporarily store the second data received from the output drivers while the input buffers and the output drivers are enabled.

12. The method of claim 7, wherein the read command signal and the write command signal are activated internally by a control unit in the semiconductor memory device.

13. The method of claim 12, wherein the control unit is configured to receive a test command signal from an external test device, and the read command signal and the write command signal are activated based on the test command signal.

14. A semiconductor memory device, comprising:
a data pad unit comprising a plurality of data pads; and
a memory cell array,
wherein the semiconductor memory device is configured to receive first data from an external device via one or more test pads corresponding to one or more of the plurality of data pads, write the first data to the memory cell array, load second data from the memory cell array onto the plurality of data pads, rewrite the second data on the plurality of data pads to the memory cell array, and output test result data based on the rewritten data,
wherein rewriting the second data on the plurality of data pads comprises loading the second data from the memory cell array onto the data pads in response to activating a read command signal, and rewriting the second data on the plurality of data pads to the memory cell array in response to activating a write command signal,
wherein the write command signal is based on a delay time, and the delay time corresponds to a time interval occurring between receiving the read command signal and loading the second data onto the plurality of data pads.

15. The semiconductor memory device of claim 14, further comprising a data path unit configured to transmit data between the data pad unit and the memory cell array.

16. The semiconductor memory device of claim 15, wherein the data path unit comprises a switching unit configured to control electrical connections between the plurality of data pads and the memory cell array.

17. The semiconductor memory device of claim 16, further comprising an error detection unit configured to generate the test result data based on a logic operation performed on the rewritten data.

18. The semiconductor memory device of claim 17, wherein the error detection unit comprises a comparison unit comprising three exclusive NOR (XNOR) logic gates and an AND logic gate.

19. The semiconductor memory device of claim 17, further comprising a control unit configured to generate a control signal that controls the semiconductor memory device.

20. The semiconductor memory device of claim 19, wherein the control signal comprises at least one of a switching control signal configured to control a switching operation of the data pad unit, an enable signal configured to control the data path unit, or an error detection control signal configured to control the error detection unit.

* * * * *